United States Patent [19]
Shiu et al.

[11] Patent Number: 5,883,004
[45] Date of Patent: Mar. 16, 1999

[54] METHOD OF PLANARIZATION USING INTERLAYER DIELECTRIC

[75] Inventors: Hao-Kuang Shiu, Hsinchu; Kun-Lin Wu, Taichung; Horng-Bor Lu; Jenn-Tarng Lin, both of Hsinchu, all of Taiwan

[73] Assignee: United Microelectronics Corp., Hsinchu, Taiwan

[21] Appl. No.: 920,172

[22] Filed: Aug. 25, 1997

[51] Int. Cl.$^6$ .................................................. H01L 21/00
[52] U.S. Cl. ............................ 438/692; 216/38; 438/697
[58] Field of Search ....................... 216/38, 88; 438/691, 438/692, 697, 699, 747, 748

[56] References Cited

U.S. PATENT DOCUMENTS

| | | | |
|---|---|---|---|
| 5,250,472 | 10/1993 | Chen et al. | 216/38 X |
| 5,674,783 | 10/1997 | Jang et al. | 438/692 X |
| 5,674,784 | 10/1997 | Jang et al. | 438/692 |
| 5,700,349 | 12/1997 | Tsukamoto et al. | 216/38 X |

*Primary Examiner*—William Powell
*Attorney, Agent, or Firm*—Merchant, Gould, Smith, Edell, Welter & Schmidt

[57] ABSTRACT

A method for planarizing interlayer dielectric is disclosed. The present invention includes firstly forming a barrier layer over a semiconductor substrate. Next, a buffer layer is formed on the barrier layer by a spin-on-glass technique. A dielectric layer is formed on the buffer layer, wherein etch rate of the dielectric layer is larger than etch rate of the buffer layer, and the barrier layer serves as a block of autodoping coming from the dielectric layer. Finally, the dielectric layer is etched back using the buffer layer as buffer, thereby planarizing the dielectric layer.

16 Claims, 2 Drawing Sheets

METHOD OF PLANARIZATION USING INTERLAYER DIELECTRIC

BACKGROUND OF THE INVENTION

1. Field of the Invention

The present invention relates to a planarization method, and particularly to a method of planarization using interlayer dielectric and a buffer layer.

2. Description of the Prior Art

The starting material for a very large scale integration (VLSI) circuit is ideally flat. After a great number of processes required to fabricate the VLSI circuits are performed, an increasing nonplanar surface occurs as the process proceeds to the metallization stage. This nonplanarity generally results in the difficulty in transferring fine-line patterns over the wafer. FIG. 1 shows a cross-sectional view illustrative of a conventional planarization method using a borophosilicate glass (BPSG) layer 10 as interlayer dielectric (ILD), which serves as an interlayer between metal layers and the underlying transistors. In this conventional fabrication, a barrier layer 8 is firstly deposited over the transistors. This barrier layer 8 is used to block autodoping of Bs or Ps from the BPSG layer 10 above. Dashed line 12 denotes the surface after the initially deposited BPSG layer 10 is reflowed. A chemical-mechanical polishing (CMP) method is then utilized to achieve a global planarization over the substrate 6. Unfortunately, the polishing rate using the CMP over the BPSG layer 10 varies greatly according to nonuniform concentration distribution of Bs or Ps. More specifically, the polishing rate over the region having low concentration becomes large, and vice versa. Therefore, a nonplanar surface 14 is thus produced, thereby degrading the following metallization process.

SUMMARY OF THE INVENTION

In accordance with the present invention, a method is provided for planarizing interlayer dielectric to substantially reduce thermal budget and polishing time. In one embodiment, a barrier layer is firstly formed over a semiconductor substrate, and a buffer layer is then formed on the barrier layer by a spin-on-glass technique. The buffer layer may be cured to strengthen bonding in the buffer layer. A borophosilicate glass (BPSG) layer is formed on the buffer layer, wherein the polishing rate of the borophosilicate glass layer is larger than the polishing rate of the buffer layer, and the barrier layer serves as a block of autodoping coming from the borophosilicate glass layer. Finally, the borophosilicate glass layer is polished using the buffer layer as buffer by a chemical-mechanical polishing, thereby planarizing the borophosilicate glass layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 2:
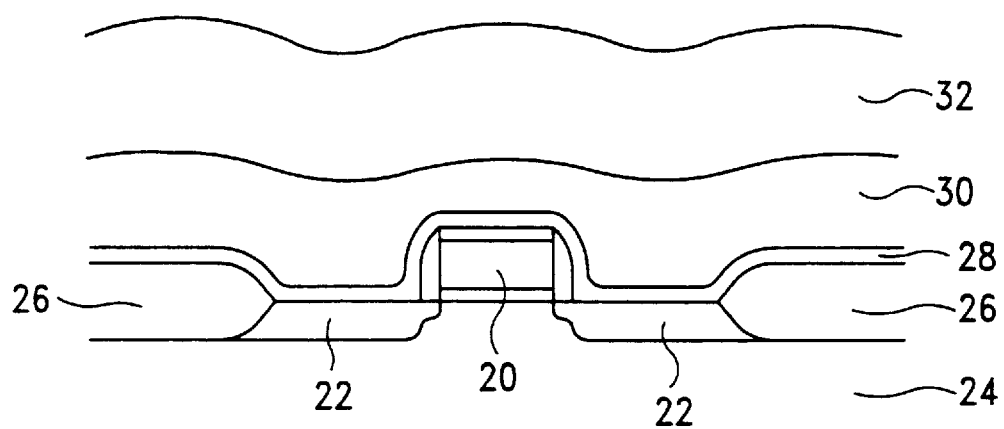
FIG. 2 shows a cross-sectional view illustrative of a planarization method in accordance of one embodiment of the present invention.

Referring to FIG. 2, a metal-oxide-semiconductor field effect transistor (MOSFET) having a gate 20 and source/drain 22 is conventionally formed in and on the substrate 24. Field oxide (FOX) 26 is conventionally formed on the FOX region 26.

A thin dielectric layer 28 having a thickness of about 1500 angstroms is then conformably formed over the substrate 24 and the gate 20. In this embodiment, the dielectric layer 28 is a silicon oxide layer preferably formed by the pyrolytic oxidation of tetraethylorthosilane (TEOS) carried by atmospheric pressure chemical vapor deposition (APCVD) or low pressure chemical vapor deposition (LPCVD) at about 650°–750° C., and proceeded as follows:

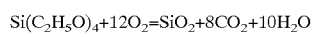

Alternative method such as conventional high-density plasma (HDP) may be used to form this silicon oxide layer 28. Other material such as silicon nitride may also be used instead of silicon oxide. The dielectric layer 28 is primarily used as a barrier layer to block autodoping of Bs or Ps from a borophosilicate glass (BPSG) layer 32, which will be described later.

Atop the barrier layer 28 forms a buffer layer 30, which is preferably formed, in this embodiment, by a conventional spin-on-glass (SOG) technique. The thickness of this buffer layer 30 is about 3000 angstroms, but can range from about 1000 to 10000 angstroms. In this embodiment, methylpolysiloxane is preferably used. Subsequently, the buffer layer 30 may be cured at about 250°–500° C. in 0.5–4 hours, so that the chemical bonding of the methylpolysiloxane is cross linked, and strengthened. The method used in the curing may be vacuum, $N_2$, or E-beam cure.

Figure 1:
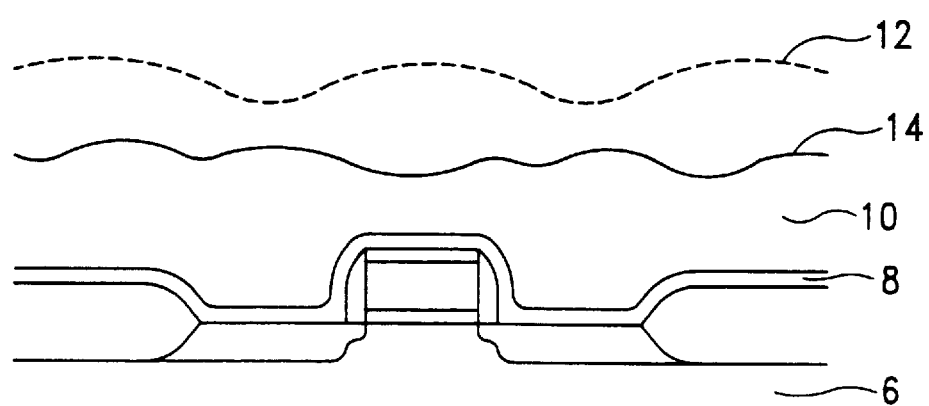
FIG. 1 shows a cross-sectional view illustrative of a conventional planarization method using a borophosilicate glass (BPSG) layer as interlayer dielectric (ILD)

Next, a dielectric layer 32 such as silicon oxide layer is formed on the buffer layer 30. In this embodiment, a BPSG is preferably used as the material of this dielectric layer 32, which is formed by any suitable chemical vapor deposition (CVD) method, using co-oxidation of $SiH_4$, $B_2H_6$, and $PH_3$ with $O_2$ and $N_2O$, in a nitrogen carrier gas. Typical temperature for forming the BPSG layer 32 is about 350°–400° C. for plasma enhanced chemical vapor deposition (PECVD), and 400°–450° C. in the absence of plasma enhancement. Alternative material such as silicon oxide formed by plasma enhanced tetraethylorthosilane (PETEOS) may be used. The thickness of the dielectric layer 32 is about 1000–5000 angstroms, which is thinner compared to that used in the conventional method (7500 angstroms in the BPSG layer 10 of FIG. 1). It is noted that the BPSG layer 32 is thin enough to eliminate the subsequent reflow step of the BPSG layer 32, thereby reducing thermal budget in fabricating very large scale integration (VLSI) circuits. Further, elimination of the reflow step substantially reduces autodoping of Bs and Ps.

Figure 3:
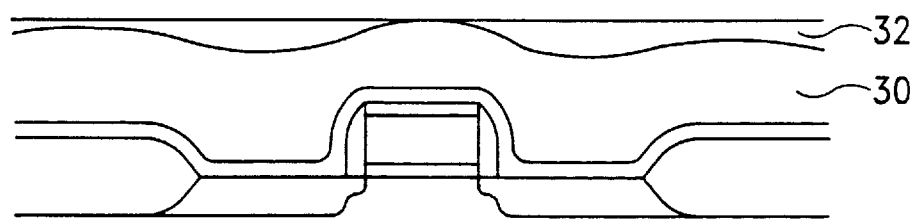
FIG. 3 shows a cross-sectional view illustrative of the planarization method in accordance of the embodiment of the present invention, wherein the interlayer dielectric has a substantially uniform surface.

Finally, a planarization method such as chemical-mechanical polishing (CMP) method is performed over the dielectric layer 32. The buffer layer 30 is generally used in the present invention as a buffer (or cushion) during polishing, because of its slower polishing rate than the dielectric layer 32, therefore substantially improving the resulting uniformity of the polished dielectric layer 32 as shown in FIG. 3. Furthermore, the polishing time is substantially reduced due to the fact that a thin dielectric layer 32 is used, and the polishing of a non-reflowed dielectric layer 32 becomes faster, thereby increasing the throughput in fabricating VLSI circuits.

Although specific embodiments have been illustrated and described, it will be obvious to those skilled in the art that various modifications may be made without departing from the spirit which is intended to be limited solely by the appended claims.

What is claimed is:

1. A method of planarization using interlayer dielectric, comprising:

forming a barrier layer over a semiconductor substrate;

forming a buffer layer on said barrier layer, said buffer layer being formed by a spin-on-glass technique;

forming a dielectric layer on said buffer layer, etch rate of said dielectric layer being larger than etch rate of said buffer layer, said barrier layer serving as a block of autodoping coming from said dielectric layer; and etching back said dielectric layer using said buffer layer as buffer, thereby planarizing said dielectric layer.

2. The method according to claim 1, further comprising curing said buffer layer to strengthen bonding therein.

3. The method according to claim 1, wherein said dielectric layer has a thickness of about 1000–10000 angstroms.

4. The method according to claim 1, wherein said barrier layer comprises silicon oxide.

5. The method according to claim 1, wherein said barrier layer comprises tetraethylorthosilane.

6. The method according to claim 1, wherein said barrier layer comprises silicon nitride.

7. The method according to claim 1, wherein said buffer layer comprises methylpolysiloxane.

8. The method according to claim 1, wherein said dielectric layer comprises borophosilicate glass.

9. The method according to claim 1, wherein said dielectric layer comprises tetraethylorthosilane formed by plasma enhanced chemical vapor deposition.

10. The method according to claim 1, wherein said dielectric layer is etched back by a chemical-mechanical polishing.

11. A method of planarization using interlayer dielectric, comprising:

forming a barrier layer over a semiconductor substrate;

forming a buffer layer on said barrier layer, said buffer layer being formed by a spin-on-glass technique;

curing said buffer layer to strengthen bonding therein;

forming a borophosilicate glass layer on said buffer layer, polishing rate of said borophosilicate glass layer being larger than polishing rate of said buffer layer, said barrier layer serving as a block of autodoping coming from said borophosilicate glass layer; and polishing said borophosilicate glass layer using said buffer layer as buffer by a chemical-mechanical polishing, thereby planarizing said borophosilicate glass layer.

12. The method according to claim 11, wherein said borophosilicate glass layer has a thickness of about 1000–5000 angstroms.

13. The method according to claim 11, wherein said barrier layer comprises silicon oxide.

14. The method according to claim 11, wherein said barrier layer comprises tetraethylorthosilane.

15. The method according to claim 11, wherein said barrier layer comprises silicon nitride.

16. The method according to claim 11, wherein said buffer layer comprises methylpolysiloxane.

* * * * *